US007869251B2

(12) United States Patent
Venkatraman et al.

(10) Patent No.: US 7,869,251 B2
(45) Date of Patent: Jan. 11, 2011

(54) SRAM BASED ONE-TIME-PROGRAMMABLE MEMORY

(75) Inventors: Ramnath Venkatraman, San Jose, CA (US); Ruggero Castagnetti, Menlo Park, CA (US); Subramanian Ramesh, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 295 days.

(21) Appl. No.: 12/239,469

(22) Filed: Sep. 26, 2008

(65) Prior Publication Data

US 2010/0080035 A1 Apr. 1, 2010

(51) Int. Cl.
*G11C 17/00* (2006.01)
(52) U.S. Cl. ...................................... 365/104; 365/154
(58) Field of Classification Search .................. 365/94, 365/96, 104, 154
See application file for complete search history.

(56) References Cited

U.S. PATENT DOCUMENTS

| | | | |
|---|---|---|---|
| 5,603,011 A | 2/1997 | Piazza | |
| 5,918,047 A | 6/1999 | Leavitt et al. | |
| 6,041,008 A * | 3/2000 | Marr | 365/225.7 |
| 6,744,660 B2 * | 6/2004 | Smith et al. | 365/154 |
| 6,822,888 B2 | 11/2004 | Peng | |
| 7,136,303 B2 * | 11/2006 | Smith et al. | 365/185.08 |
| 7,242,072 B2 | 7/2007 | Kothandaraman | |
| 7,369,452 B2 * | 5/2008 | Kenkare et al. | 365/225.7 |
| 2006/0023503 A1 * | 2/2006 | Lee | 365/185.05 |
| 2007/0133334 A1 * | 6/2007 | Peng et al. | 365/225.7 |
| 2009/0109723 A1 * | 4/2009 | Buer et al. | 365/96 |

* cited by examiner

*Primary Examiner*—Anh Phung
*Assistant Examiner*—Douglas King
(74) *Attorney, Agent, or Firm*—Christopher P. Whitham; Cochran Freund & Young LLC

(57) ABSTRACT

Disclosed is a method and device for providing fast-response One-Time-Programmable (OTP) memory based on SRAM memory technology and the inherent breakdown characteristics of a MOS transistor. Each memory cell of an SRAM memory cell circuit is connected to a programming circuit. The programming circuit is comprised of two groups of MOS transistors connected to the storage nodes (SN and SNB, where SNB is the complementary value of SN) of the two cross-coupled inverters of the SRAM memory circuit. A desired data set is loaded into the circuit and then is burned-in by applying and repeatedly cycling a "burn-in" voltage across the source and drain of the MOS transistors of the programming circuit that approaches the ON STATE trigger voltage of the characteristic bipolar junction transistor contained within the MOS transistors. Upon repeated cycling of the source-to-drain voltage, the targeted MOS transistor within the programming circuit breaks down and shorts across the gate, drain, and/or source of the transistor. When the system is returned to normal operation, the programming circuits will be connected to ground, Vdd or Vss and one of the two nodes of the SRAM cell circuit will be shorted through the programming circuit to ground, Vdd or Vss, thus, forcing a retention of the programmed data state.

18 Claims, 6 Drawing Sheets

700 SCHEMATIC OF AN EMBODIMENT OF ONE-TIME-PROGRAMMABLE (OTP) MEMORY CELL CIRCUIT

300 FOLDED-GATE PMOS TRANSISTOR SCHEMATIC SYMBOL WITH VOLTAGE VALUES INDICATED (SHOWN AS SINGLE DEVICE)

302 PHYSICAL LAYOUT OF FOLDED-GATE PMOS TRANSISTOR WITH VOLTAGE VALUES INDICATED

400 EXPERIMENTAL "ON" STATE Ids vs Vds OF PMOS FOLDED-GATE TRANSISTOR CYCLING CLOSE TO $V_{TR}$ FOR 9 CYCLES

402 EXPERIMENTAL "OFF" STATE Ids vs Vds OF PMOS FOLDED-GATE DEVICE CYCLING CLOSE TO $V_{TR}$ FOR 9 CYCLES

500 EXPERIMENTAL GATE LEAKAGE CURRENT vs. NUMBER OF STRESS CYCLES OF PMOS FOLDED-GATE TRANSISTOR

600 SIMPLIFIED DIAGRAM OF VOLTAGE CYCLING OPERATION USED TO PROGRAM (BREAK / SHORT) A MOS TRANSISTOR

SRAM BASED ONE-TIME-PROGRAMMABLE MEMORY

BACKGROUND OF THE INVENTION

One-Time-Programmable (OTP) memory devices provide a type of non-volatile memory (i.e., memory that retains its state across power cycles) that may be written with a desired data set and then programmed/"burned-in" to store the desired data set as Read -Only Memory (ROM). OTP memory may only be programmed with a data set one time, unlike some other forms of programmable non-volatile memory. For instance, Flash memory, Electronically Erasable Programmable Read-Only Memory (EEPROM or $E^2$PROM), and Erasable Programmable Read-Only Memory (EPROM) are common examples of various types of programmable memory that may be erased and reprogrammed multiple times. OTP memory may be used where it is not necessary and/or it is not desirable to program the memory more than one time. Some examples of potential applications for OTP memory include: chip identification (chip ID), security applications (e.g., encryption keys and security identification/ID), memory repair, analog Integrated Circuit (IC) trimming/calibration, Application-Specific Integrated Circuit (ASIC) software/firmware code storage, and smart card applications. Security applications where each device requires a unique identification, but where it is not desirable for a user to later change the security identification are a good example where an OTP memory is preferable over a re-writeable type of non-volatile memory. Similarly, using OTP memory may be preferable for storing software/firmware code for use by an ASIC that is part of an end-device to ensure that an end user does not change the software/firmware code without the permission and/or assistance of the manufacturer of the end-device.

SUMMARY OF THE INVENTION

An embodiment of the present invention may comprise a method to provide high-speed One-Time-Programmable (OTP) memory comprising: providing a Static Random Access Memory (SRAM) cell circuit using Metal-Oxide Semiconductor (MOS) type transistors that has a first electrical node SN and a second electrical node SNB, the MOS type transistors having two predetermined voltage ranges corresponding to data values of LOW and HIGH in accordance with characteristics of MOS transistor technology used to create the MOS type transistors, the first electrical node SN having a node SN voltage value corresponding to a SN data value, the second electrical node SNB having a node SNB voltage value corresponding to a SNB data value, and the SNB data value being a complementary data value of the SN data value; providing a Vdd voltage corresponding to a HIGH target voltage for the HIGH data value; providing a Vss voltage corresponding to a LOW target voltage for the LOW data value; providing a plurality of damageable MOS type transistors that have equivalent voltage ranges for the LOW and HIGH data values as the SRAM cell circuit MOS type transistors, the plurality of damageable MOS type transistors having gates, drains, and sources, the damageable MOS transistors further having characteristic parasitic bipolar junction transistors present within the damageable MOS transistors that causes the damageable MOS transistors to break down and short out when a burn -in voltage that approaches a trigger voltage $V_{TR}$ of the damageable MOS transistors is applied across the drains and the sources of the damageable MOS transistors when the damageable MOS transistors are in an ON STATE but not when the damageable MOS transistors are in an OFF STATE, the trigger voltage $V_{TR}$ of the damageable MOS transistor being a voltage matching a position on a characteristic current to voltage curve of the damageable MOS technology characteristics where a snapback characteristic of the characteristic parasitic bipolar junction transistors appears on the characteristic current to voltage curve when the damageable MOS transistors are in the ON STATE, the ON STATE and the OFF STATE of the damageable transistors being controlled by a gate voltage applied to the gates of the damageable MOS transistors in accordance with damageable MOS technology characteristics of the damageable MOS type transistors, when the damageable MOS transistors are in the ON STATE current flow between the drains and the sources of the damageable MOS transistors is permitted, when the damageable MOS transistors are in the OFF STATE current flow between the drains and the sources of the damageable MOS transistors is substantively not permitted; providing a programming circuit that has a first group of MOS transistors and a second group of MOS transistors, the first group of MOS transistors and the second group of MOS transistors being comprised of subsets of the plurality of damageable MOS type transistors, the first group of MOS transistors comprising at least one damageable MOS transistor, the gates of the first group of MOS transistors being connected to the first electrical node SN of the SRAM cell, the drains and the sources of the first group of MOS transistors being connected in series between a programming Power Line PL and a third electrical node C, the second group of MOS transistors comprising at least one damageable MOS type transistor, the gates of the second group of MOS transistors being connected to the second electrical node SNB of the SRAM cell, the drains and the sources of the second group of MOS transistors being connected in series between the programming Power Line PL and the third electrical node C; combining the SRAM cell circuit and the programming circuit as an OTP cell circuit; powering the OTP cell circuit such that the SRAM cell circuit is operational and the programming Power Line PL and the third electrical node C are at a normal operation equivalent voltage level; storing a desired data value in the SRAM cell circuit such that the electrical node SN is at the desired data value and the electrical node SNB is at the complementary data value of the desired data value; programming the programming circuit to a programmed state by connecting the third electrical Node C to the Vdd voltage and by applying a programming voltage to the programming Power Line PL, the programming voltage being a voltage that causes the voltage differential between the programming Power Line PL and the third electrical node C to substantively be the burn-in voltage, thereby causing whichever of the first group of MOS transistors and the second group of MOS transistors is in the ON STATE to break down and short out, which of the first group of MOS transistors and the second group of MOS transistors is in the ON STATE being determined by the SN data value connected to the gates of the first group of MOS transistors and the SNB data value that is the complementary data value of the SN data value connected to the gates of the second group of MOS transistors of the SRAM cell circuit; and setting the programming Power Line PL and the third electrical node C to the normal operation equivalent voltage level applied prior to the programming such that whichever of the first group of MOS transistors connected to electrical node SN of the SRAM cell circuit and the second group of MOS transistors connected to the electrical node SNB of the SRAM cell circuit was broken down and shorted out during programming to electrically connect the respective electrical node SN or the electrical node SNB of the SRAM cell circuit to the normal operation equivalent voltage level of the electrical node C and the programming Power Line PL, thereby forcing the respective electrical node SN or electrical node SNB to correspond to the HIGH or LOW data value corresponding to the normal operation equivalent voltage level of the electrical node C and the programming Power Line PL regardless of attempts to write a different data value to the SRAM cell circuit.

An embodiment of the present invention may further comprise a One-Time-Programmable (OTP) memory device comprising: a Static Random Access Memory (SRAM) cell circuit using Metal-Oxide Semiconductor (MOS) type transistors that has a first electrical node SN and a second electrical node SNB, the MOS type transistors having two predetermined voltage ranges corresponding to data values of LOW and HIGH in accordance with characteristics of MOS transistor technology used to create the MOS type transistors, the first electrical node SN having a node SN voltage value corresponding to a SN data value, the second electrical node SNB having a node SNB voltage value corresponding to a SNB data value, and the SNB data value being a complementary data value of the SN data value; a Vdd voltage corresponding to a HIGH target voltage for the HIGH data value; a Vss voltage corresponding to a LOW target voltage for the LOW data value; a plurality of damageable MOS type transistors that have equivalent voltage ranges for the LOW and HIGH data values as the SRAM cell circuit MOS type transistors, the plurality of damageable MOS type transistors having gates, drains, and sources, the damageable MOS transistors further having characteristic parasitic bipolar junction transistors present within the damageable MOS transistors that causes the damageable MOS transistors to break down and short out when a burn-in voltage that approaches a trigger voltage $V_{TR}$ of the damageable MOS transistors is applied across the drains and the sources of the damageable MOS transistors when the damageable MOS transistors are in an ON STATE but not when the damageable MOS transistors are in an OFF STATE, the trigger voltage $V_{TR}$ of the damageable MOS transistors being a voltage matching a position on a characteristic current to voltage curve of the damageable MOS technology characteristics where a snapback characteristic of the characteristic parasitic bipolar junction transistors appears on the characteristic current to voltage curve when the damageable MOS transistors are in the ON STATE, the ON STATE and the OFF STATE of the damageable transistors being controlled by a gate voltage applied to the gates of the damageable MOS transistors in accordance with damageable MOS technology characteristics of the damageable MOS type transistor, when the damageable MOS transistors are in the ON STATE current flow between the drains and the sources of the damageable MOS transistors is permitted, when the damageable MOS transistors are in the OFF STATE current flow between the drains and the sources of the damageable MOS transistors is substantively not permitted; a programming circuit that has a first group of MOS transistors and a second group of MOS transistors, the first group of MOS transistors and the second group of MOS transistors being comprised of subsets of the plurality of damageable MOS type transistors, the first group of MOS transistors comprising at least one damageable MOS transistor, the gates of the first group of MOS transistors being connected to the first electrical node SN of the SRAM cell, the drains and the sources of the first group of MOS transistors being connected in series between a programming Power Line PL and a third electrical node C, the second group of MOS transistors comprising at least one damageable MOS type transistor, the gates of the second group of MOS transistors being connected to the second electrical node SNB of the SRAM cell, the drains and the sources of the second group of MOS transistors being connected in series between the programming Power Line PL and the third electrical node C; an OTP cell circuit that is a combination of the SRAM cell circuit and the programming circuit; and, a programming system for the OTP cell circuit that: powers the OTP cell circuit such that the SRAM cell circuit is operational and the programming Power Line PL and the third electrical node C are at a normal operation equivalent voltage level; stores a desired data value in the SRAM cell circuit such that the electrical node SN is at the desired data value and the electrical node SNB is at the complementary data value of the desired data value; programs the programming circuit to a programmed state by connecting the third electrical Node C to the Vdd voltage and by applying a programming voltage to the programming Power Line PL, the programming voltage being a voltage that causes the voltage differential between the programming Power Line PL and the third electrical node C to substantively be the burn-in voltage, thereby causing whichever of the first group of MOS transistors and the second group of MOS transistors is in the ON STATE to break down and short out, which of the first group of MOS transistors and the second group of MOS transistors is in the ON STATE being determined by the SN data value connected to the gates of the first group of MOS transistors and the SNB data value that is the complementary data value of the SN data value connected to the gates of the second group of MOS transistors of the SRAM cell circuit; and, sets the programming Power Line PL and the third electrical node C to the normal operation equivalent voltage level applied prior to the programming such that whichever of the first group of MOS transistors connected to electrical node SN of the SRAM cell circuit and the second group of MOS transistors connected to the electrical node SNB of the SRAM cell circuit was broken down and shorted out during programming to electrically connect the respective electrical node SN or the electrical node SNB of the SRAM cell circuit to the normal operation equivalent voltage level of the electrical node C and the programming Power Line PL, thereby forcing the respective electrical node SN or electrical node SNB to correspond to the HIGH or LOW data value corresponding to the normal operation equivalent voltage level of the electrical node C and the programming Power Line PL regardless of attempts to write a different data value to the SRAM cell circuit.

An embodiment of the present invention may further comprise a method for programming a One-Time-Programmable (OTP) memory array comprising: providing the OTP memory array of OTP memory cell circuits, each OTP memory cell circuit of the array of OTP memory array comprising an SRAM cell circuit and a programming circuit based on Metal-Oxide Semiconductor (MOS) transistor technology; writing intended data to the SRAM cell circuits of the OTP memory array; reading stored data from the SRAM cell circuits of the OTP memory array; verifying that the intended data was properly written to the SRAM cell circuits of the OTP memory array by comparing the intended data written to the OTP memory array to the stored data read from the SRAM cell circuits of the OTP memory array; permanently storing the intended data into the OTP memory array by applying a burn-in voltage to the programming circuits of the OTP memory array such that select MOS transistors of the programming circuit break down and short out causing associated SRAM cell circuits of the programming circuits to permanently hold the intended data contained in the SRAM cell circuits of the OTP memory array when the process of permanently storing was initiated and when the OTP memory is powered on, the burn-in voltage being a voltage that approaches a trigger voltage $V_{TR}$ of a parasitic bipolar transistor that is a characteristic of MOS transistor technology used to create the OTP memory array; powering off the OTP memory array; powering on the OTP memory array; reading OTP data form the OTP memory array; and, verifying that the intended data was properly programmed into the OTP memory array by comparing the intended data written to the OTP memory array to the OTP data read from the OTP memory array after the powering off and powering on the OTP memory array.

DETAILED DESCRIPTION OF THE EMBODIMENTS

Figure 1A:
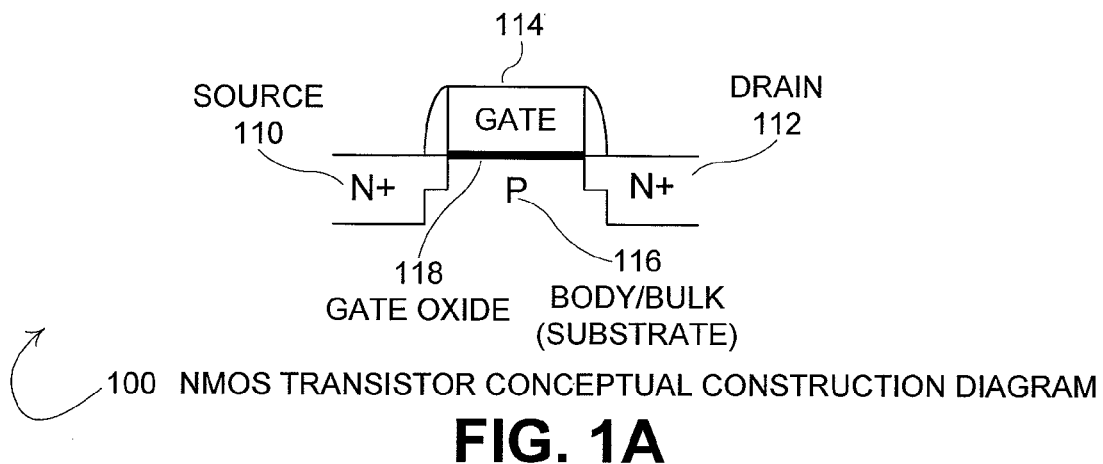
FIG. 1A is a conceptual construction diagram of an N-channel Metal-Oxide Semiconductor (NMOS) transistor.

There are numerous types of OTP memory available. Two common OTP memory technologies are made using conducting fuse links to store the desired data. The OTP with conducting fuse links is programmed by breaking the fuse links. Typically the fuse links are broken either by a laser pulse (aka. laser blown fuses) or by an electrical pulse (aka. electrically blown fuses). Other OTP memory technologies are also being provided as proprietary technologies from various electronics companies. Many of the OTP memory technologies available are designed to keep memory wafer processing costs unchanged compared to a standard process flow. However, the OTP memory may require higher voltage supplies (either on-chip or on the tester) to "burn-in"/program the memory.

Typically, OTP memory technology is designed to be compact and reliable with little regard given to the electrical performance (i.e., speed) of the OTP memory because the content of the OTP memory is usually only accessed during the power-up sequence of a device. If the content of the OTP memory needs to be accessed multiple times during normal operation and the performance of the memory circuit is a consideration, the data stored in the OTP memory is typically loaded into a shadow-RAM (Random Access Memory) after power-up for later, and faster, access by the device. Typically Static RAM (SRAM) is used to provide the shadow-RAM since SRAM has favorable electronic performance characteristics (i.e., SRAM responds quickly to read requests). SRAM memory is volatile (i.e., loses the contents of the memory state when powered off) so it may not be used for OTP memory, but SRAM memory represents some of the fastest available memory technology available and is often used when high electrical performance of the memory is desired.

Typical One-Time-Programmable (OTP) memory has poor electrical performance characteristics and is often too slow to be repeatedly accessed during normal end device operation. To address memory speed issues, some systems employ faster shadow-RAM (Random-Access Memory) and read the contents of the OTP memory into the shadow-RAM at system start-up and then access the shadow-RAM during normal operation. Thus, a system that has a need for fast memory access of OTP memory typically requires twice the memory necessary to store the desired data, the OTP memory itself and a duplicate amount of memory for the shadow-RAM. Due to the high-speed nature of Static RAM (SRAM), SRAM is the typical type of RAM chosen for implementing the shadow-RAM in a high-speed OTP memory system.

An embodiment obviates the need for shadow-RAM by creating a high-speed OTP memory array based on SRAM technology. Each memory cell of the OTP memory array is comprised of an SRAM memory cell circuit connected to a "programming" circuit. The SRAM memory cell circuit and the programming circuit are implemented utilizing Metal-Oxide Semiconductor (MOS) type transistors. The MOS type transistor technology may also be referred to as Metal-Oxide Semiconductor Field Effect Transistor (MOSFET) technology. Since SRAM circuits are comprised of cross-coupled inverters, the SRAM circuit inherently maintains both the intended state and the complement of the intended state (i.e., inverse states) of the desired data. By shorting either the connection to the intended state or the connection to the complement of the intended state in the SRAM circuit to either Vss (LOW data state voltage, typically electrical ground or 0 volts) or to Vdd (i.e., HIGH data state voltage), the SRAM circuit cell can be forced to remain at a fixed data state. The programming circuit takes advantage of the characteristic of a MOS transistor to break down (i.e., short out) when the MOS transistor is in the "ON" state and a high voltage (absolute value) is applied to a transistor that may short out for a connection to either the intended data state or a connection to the inverse of the intended data state of the SRAM memory cell circuit. Which of the intended or complementary connection is shorted out is dictated by the current data value stored in the SRAM cell circuit when the OTP cell circuit is programmed. The break down (i.e., shorting out) of select MOS transistors in the programming circuit causes the SRAM circuit to be forced to the "programmed" data state and an embodiment will retain the desired data set in the OTP memory array across power cycles to become non-volatile memory. Thus, an embodiment of the OTP memory cell circuit provides one-time-programmable (OTP)

memory that has the high-speed electrical performance of SRAM technology but that also provides non-volatile data storage.

FIG. 1A is a conceptual construction diagram 100 of an N-channel Metal-Oxide Semiconductor (NMOS) transistor. An NMOS Field Effect Transistor (FET) is constructed of N+ doped semiconductor material at the source 110, P doped semiconductor material at the body (aka. bulk or substrate), and N+ doped semiconductor material at the drain 116. The material at the gate (g) 114 is typically made up of a material such as doped polysilicon or a metal such as Tungsten (W), Molybdenum (Mo), Tantalum Nitride (TaN), etc. The material at the gate (g) 114 is separated from the main body 116 by a thin layer of gate oxide 118. The thin insulating material of the gate oxide layer 118 is typically comprised of a form of oxide, such as silicon dioxide, silicon oxynitride, hafnium oxide, or others. Electrode connections are made to the gate (g) 114 material, the source (s) 110 semiconductor material and the drain (d) 112 semiconductor material. In most cases there is also an electrode connection to the body/substrate (b) 116 semiconductor material. At high drain (d) 110 to source (s) 112 voltages (Vds), the gate oxide material 118 begins to break down and accumulate permanent damage. At the same time, a parasitic NPN bipolar junction transistor that is contained with every NMOS device may turn on, aided by the current that is injected into the substrate/body 116 by the MOSFET device. Combined with the large electric fields present, such an event may induce a large number of defects within the gate oxide which breaks down causing an electrical short on the source 110 to gate 114, the drain 112 to gate 114, and/or the source 110 to drain 112.

Figure 1B:
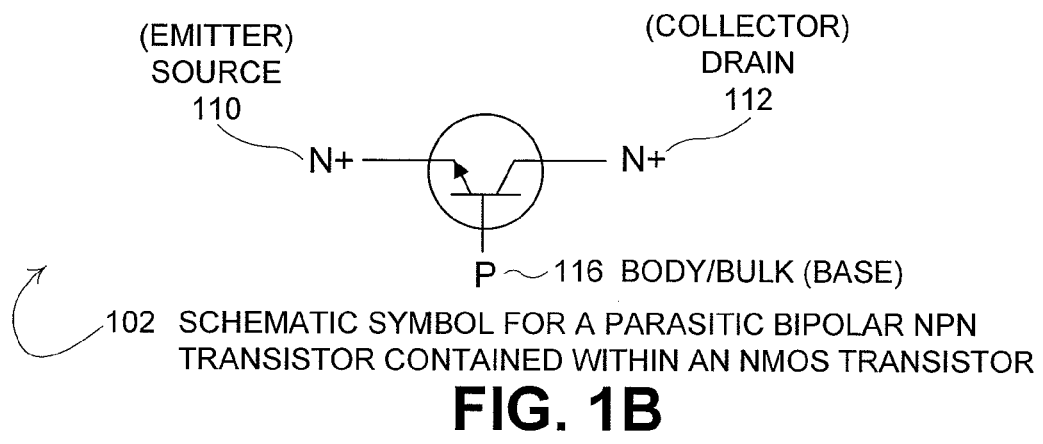
FIG. 1B is a schematic symbol representation of a parasitic bipolar NPN junction transistor contained within an NMOS transistor as a characteristic of the construction of NMOS type transistors.

FIG. 1B is a schematic symbol representation 102 of a parasitic bipolar NPN junction transistor contained within an NMOS transistor as a characteristic of the construction of NMOS type transistors. As the NMOS transistor gate 114 dielectric breaks down, the N+ source 110, P body/substrate 116, and N+ drain 112 begin to act as an NPN bipolar junction transistor. The source 110 acts as the emitter, the body/substrate 116 acts as the base, and the drain 112 acts as the collector of the bipolar junction transistor. The appearance of the affects of the bipolar junction transistor 102 in a MOS transistor 100 is not normally considered in an ideal model of a MOS transistor, but is a characteristic of a real physical implementation of a MOS transistor device. Thus, the bipolar junction transistor 102 is considered to have a parasitic, and usually undesirable, effect on the MOS transistor 100. Embodiments may beneficially utilize the effects of the breakdown of the MOS transistor to short out the electrodes of the MOS transistor in order to provide the ability to program an SRAM cell circuit.

Similar break-down and parasitic bipolar junction transistor characteristics may also be found in a P-channel MOS (PMOS) transistor. In the case of a PMOS transistor, the bipolar junction transistor has the characteristics of a PNP bipolar junction transistor rather than an NPN bipolar junction transistor.

Figure 2:
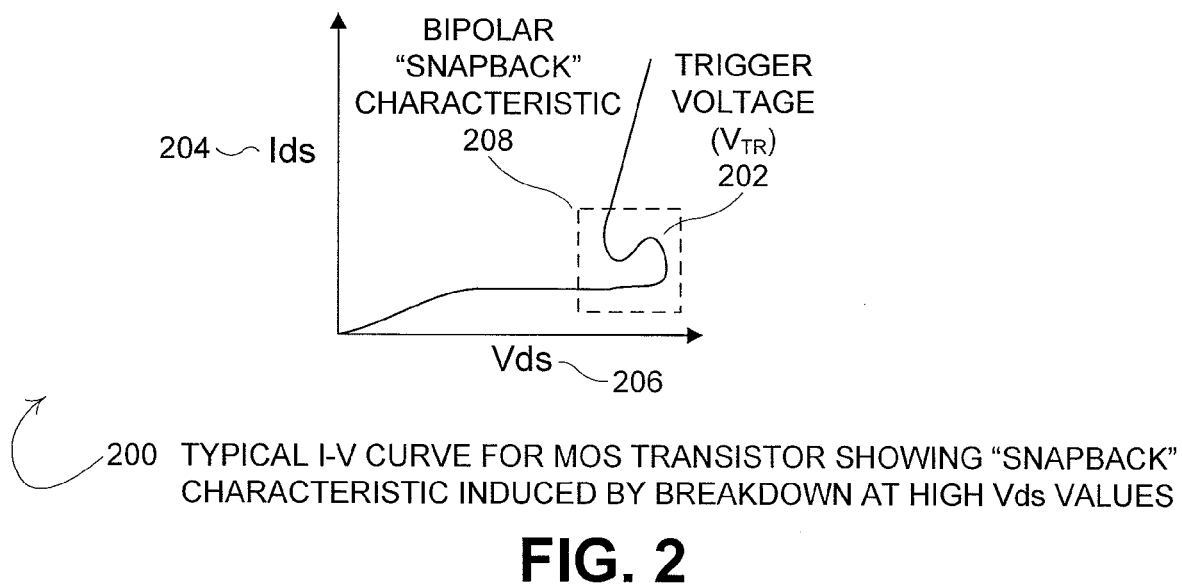
FIG. 2 is a pictorial representation of a typical current-voltage (I-V) curve for a MOS transistor showing the "snap-back" characteristic induced by the presence of a parasitic bipolar junction transistor within the MOS transistor.

FIG. 2 is a pictorial representation of a typical current-voltage (I-V) curve 200 for a MOS transistor showing the "snapback" characteristic 208 induced by the presence of a parasitic bipolar junction transistor within the MOS transistor. The I-V curve 200 graphs the drain-to-source voltage (Vds) 206 versus the drain-to-source current (Ids) 204 of the MOS transistor. As can be seen in the I-V curve 200, when Vds 206 reaches a high voltage 202 (in absolute value terms), the MOS device begins to break down and a typical "snapback" characteristic 208 is induced by the presence of a parasitic bipolar junction transistor within the MOS transistor. Triggering of the parasitic bipolar junction transistor within the MOS transistor is induced by Vds 206 voltages high enough to break down the MOS device.

The voltage that triggers the parasitic bipolar junction transistor may be referred to as the trigger voltage ($V_{TR}$) 202. $V_{TR}$ 202 is typically a function of the gate voltage (Vg) as well as the specific material composition of the MOS transistor. The material composition and the geometry of the MOS transistor controls the ultimate trigger voltages 202 applicable to the transistor, but the voltage at the gate (Vg) may cause the trigger voltage 202 to be higher or lower within MOS transistors of similar material compositions. Thus, $V_{TR}$ 202 is a function of the gate voltage (Vg) applied to the transistor. The correlation between the gate voltage (g) and the trigger voltage $V_{TR}$ 202 is likely due to the characteristic dependence of the substrate current on the gate voltage (Vg). The substrate current helps in the triggering of the parasitic bipolar junction transistor within the MOS device. Thus, the presence of a substrate current lowers the effective $V_{TR}$ 202 necessary to trigger the parasitic bipolar junction transistor. The gate voltage (Vg) of the MOS transistor controls whether the MOS transistor is in an ON STATE or an OFF STATE. When the MOS transistor is in an OFF STATE, little current (Ids) is permitted to flow between the drain and the source. In the ideal MOS transistor model in the OFF STATE, Ids is zero. For a real MOS device, a small sub-threshold "leakage" current may be present, but the end-result is that current flow between the drain and source (Ids) is nearly zero (i.e., substantively zero) when the MOS transistor is in the OFF STATE. Since there is little current flow in the substrate in the OFF STATE, the trigger voltage $V_{TR}$ 202 is relatively high for MOS transistor in the OFF STATE. When the MOS transistor is in an ON STATE, or in a partially ON STATE, current (Ids) is permitted to flow between the drain and the source. Since there is more substrate current flow in the MOS transistor in the ON STATE, the breakdown occurs earlier and the trigger voltage $V_{TR}$ 202 is lower. An embodiment may make use of the difference in trigger voltage $V_{TR}$ 202 between the OFF STATE (higher) and the ON STATE (lower) to cause MOS transistors with gate voltages (Vg) causing an ON STATE to break down (i.e., short out) while MOS transistors with gate voltages (Vg) causing an OFF STATE do not break down even though the drain to source (Vds) of both the ON STATE and OFF STATE transistors is the same. That is, transistors that are in an ON STATE break down and short out, but transistors that are in an OFF STATE do not break down and do not short out when connected to the same voltage supply.

For thin gate oxide core devices in modern Complimentary MOS (CMOS) technologies, such as 90 nm or subsequent technologies, a triggering event is usually catastrophic for the transistor device resulting in a source-to-gate, drain-to-gate, and/or source-to-drain electrical short. A typical value of $V_{TR}$ 202 for a 1.0 um×0.1 um device in 90 nm process technology is roughly −5.5V. That is, with the source at 1.0V, the drain needs to be at roughly −4.5V. For 90 nm process technology, the HIGH data state voltage is roughly 1.0V and the LOW data state voltage is roughly 0.0V. However, both the HIGH and LOW data state voltages may include a range of voltages such as HIGH being any voltage value greater than 0.7V and LOW being any voltage value below 0.4V with any voltage not in either the HIGH or LOW state being considered indeterminate. In many digital applications the HIGH data value is considered a digital '1' and the LOW data value is considered a digital '0.' In some applications a HIGH (1) data value may also be referred to as an ON data value and a LOW (0) data value may also be referred to as an OFF data value. When referring to a HIGH (1) value, it is typically meant that there is a HIGH voltage present (1.0V for 90 nm process technology). Similarly, when referring to a LOW (0) value, it is typically meant that there is a LOW voltage present (0.0V for 90 nm process technology). For purposes of discussion, this disclosure utilizes 90 nm process technology characteristics to define voltage values and MOS transistor break down characteristics. It is understood that other MOS technology with differing voltage and break down characteristics may be utilized to create additional embodiments consistent with the characteristics of the MOS technology chosen and the principles of the invention.

Through experimentation, it was observed that the shorting mechanism may be controlled by an appropriate choice of Vds (i.e., approaching or above the trigger voltage $V_{TR}$ 202 for an ON STATE transistor and below the trigger voltage $V_{TR}$ 202 for an OFF STATE transistor). Further, through experimentation it was also observed that the use of repeated ("pulsed") applications of a "burn-in" voltage that approaches the trigger voltage $V_{TR}$ 202 may permit faster and more controllable break down/short out of the MOS transistor device without as much destructive damage to the MOS transistor device. Further, by using repeated pulses the burn-in voltage may be reduced further than when a single pulse is used so there is less destructive damage to the MOS transistor device while still obtaining the desired break down/short out of the MOS transistor device. When using repeated pulses, the absolute value of the burn-in voltage may be as much as one volt less than the absolute value of the trigger voltage and still provide reasonable programming ability. Typically, a burn-in voltage within a half a volt of the trigger voltage provides the most reliable programming results. As the burn-in voltage is reduced, the number and/or duration of pulses needed to program (i.e. break down/short out) the MOS transistor device is increased since there will be less damage accumulated for each pulse using the lower burn-in voltage. Thus, depending on the gate voltage (Vg) and an appropriate choice of drain voltage (Vd) a controlled permanent break down (i.e., short) of the MOS transistor device may be avoided or forced to occur. Combining control of the break down of the MOS transistor in accordance with the gate voltage (Vg) and the fact that in a typical SRAM cell circuit there are two complementary storage nodes associated with transistors at opposite voltage data states (HIGH/LOW), one may permanently program (i.e., "burn-in") a given SRAM cell circuit depending on the data state that was written into the SRAM cell circuit prior to the electrical programming event. The modifications may be done by adding additional devices to a basic SRAM cell circuit (6T, 8T, etc.). A standard 6T SRAM cell circuit is discussed throughout this disclosure, but other embodiments may utilize other SRAM cell circuit configurations. For the example embodiment discussed in this disclosure, the additional devices are PMOS devices since PMOS devices are generally easier to implement in the typical layout of SRAM bitcell circuits. However, it is understood that the additional devices may be NMOS transistors instead of PMOS transistors. It may be necessary to change the "normal" state of the shorted voltage (e.g., connect to Vdd corresponding to a HIGH data value rather than to ground). Alternatively, one may simply load complementary data of the final desired data into the SRAM bitcells prior to programming in order to account for the fact that an NMOS transistor is in the ON STATE for the opposite value of the gate voltage (Vg) as the Vg ON STATE for a PMOS transistor. For the 90 nm process technology of the example embodiment discussed in this disclosure, a PMOS device is in the ON STATE when Vg is 0V and an NMOS device is in the ON STATE when Vg is 1V.

Figure 3A:
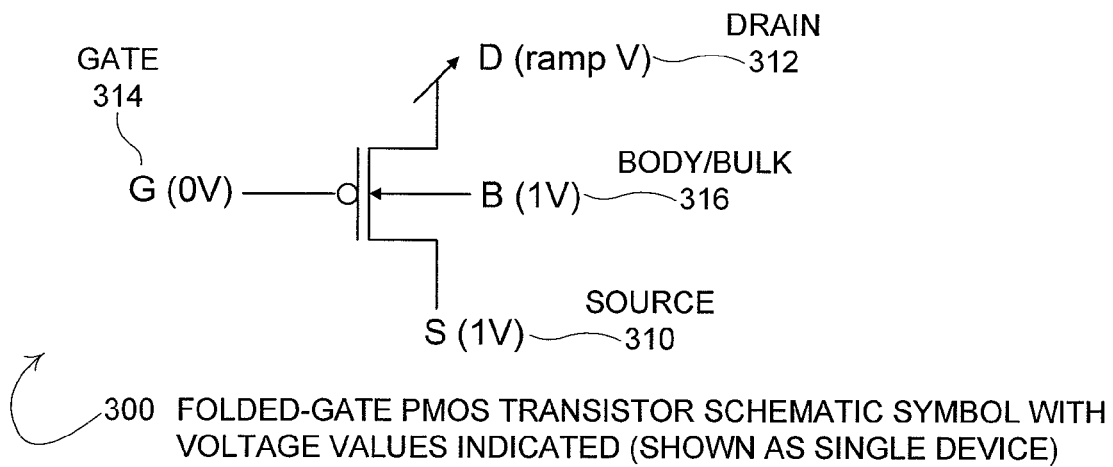
FIG. 3A is a schematic symbol representation of a folded P-channel MOS (PMOS) transistor with voltage values for programming of an embodiment shown.

FIG. 3A is a schematic symbol representation 300 of a folded P-channel MOS (PMOS) transistor with voltage values for programming of an embodiment shown. The PMOS transistor 300 illustrated in FIG. 3A is a folded-gate device. If desired, the folded-gate transistor 300 may also be schematically represented as two transistors (see FIG. 7) connected in series from drain to source. The gate 314 voltage (Vg) may be either 0V or 1V. The source 310 and body 316 are held at 1V. In order for the PMOS transistor to be "programmed," the transistor should be in the ON STATE. Thus, the gate 314 voltage (Vg) is 0V since a PMOS device is put in an ON STATE when the gate is at 0V. With the gate at 0V (PMOS device in the ON STATE), to experimentally find the proper trigger voltage $V_{TR}$, the drain 312 voltage (Vd) is ramped. For the 90 nm process technology of the example discussed in this disclosure, the drain 312 voltage (Vd) is ramped from 1V to −5V or −6V. At some value of Vd (typically between −5V and −6V) the PMOS transistor breaks down catastrophically. When the absolute value of the drain 314 voltage (Vd) is below 5V, no catastrophic failure takes place, but some lesser amount of permanent damage is observed. The lesser amount of permanent damage accumulates as the drain 314 voltage (Vd) is cycled between −5V and 1V. To enhance reliability and avoid excessive damage, it may be desirable to cycle the drain 314 voltage (Vd) to a slightly lower voltage to produce a repeated stress pattern rather than ramp the drain 314 voltage (Vd) until catastrophic failure. By cycling the drain 314 voltage (Vd) to a slightly lower voltage, the failure mechanism for the MOS transistor becomes more repeatable. When the PMOS transistor is in the OFF STATE (gate 310 voltage held at 1V), the transistor shows relatively little damage when subjected to the same ramp voltage, or especially when subjected to the cycles of the repeated stress pattern with a slightly lower voltage suggested to program/"burn-in" a device, as an ON STATE device that has been "burned-in."

Figure 3B:
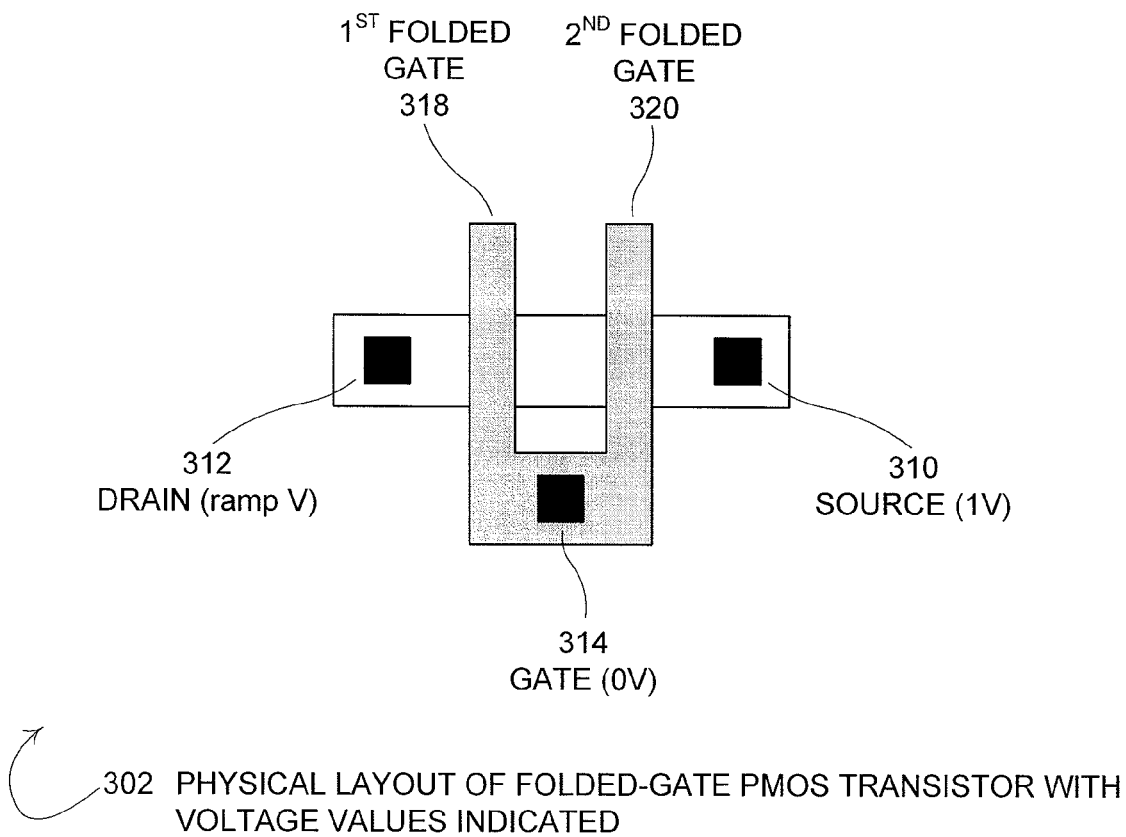
FIG. 3B is an illustration of the physical layout of a folded-gate PMOS transistor with voltage values for programming of an embodiment shown.

FIG. 3B is an illustration of the physical layout 302 of a folded-gate PMOS transistor with voltage values for programming of an embodiment shown. For a folded-gate device, there is a single drain 312 and a single source 310. The gate 310 is folded to produce a first folded gate 318 and a second folded gate 320. For programming of the folded-gate PMOS transistor illustrated in FIG. 3B, the gate 310, 318, 320 voltage (Vg) is held at 0V (i.e., the device is in the ON STATE), the source 310 voltage (Vs) is held at 1V and the drain 312 voltage (Vd) is ramped or cycled to a high voltage (absolute value) that approaches the trigger voltage ($V_{TR}$) as necessary to break down and short out the transistor.

Folded-gate transistors have slightly different electrical characteristics than a normal, "unfolded" transistor. Via experimentation, it was observed that folded-gate transistors showed more consistent and repeatable break down (i.e., programming/"burn-in") behavior in comparison to "unfolded" devices. Hence, it may be desirable to used folded-gate transistors in a programming circuit for an SRAM-based OTP cell rather than normal, "unfolded" devices.

Figure 4A:
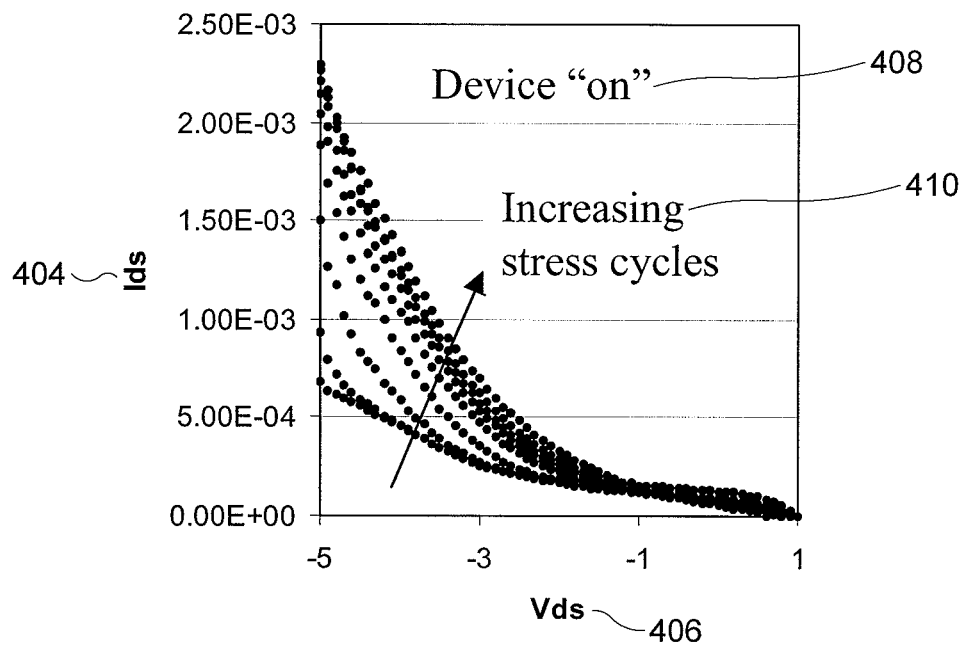
FIG. 4A is a graph of experimental current-voltage (I-V) characteristics of a PMOS folded-gate transistor when cycling the voltage close to the ON STATE trigger voltage ($V_{TR}$) for a transistor in the "ON" state.

FIG. 4A is a graph 400 of experimental current-voltage (I-V) characteristics of a PMOS folded-gate transistor when cycling the voltage close to the ON STATE trigger voltage ($V_{TR}$) for a transistor in the "ON" state 408. Each cycle ramps the drain voltage between −5V and 1V. The ON STATE I-V graph 400 shows the results of 9 cycles between −5V and 1V for a PMOS folded gate transistor (described in the disclosure with respect to FIGS. 3A & B) that is in the ON STATE 408. The ON STATE I-V graph 400 charts the applied drain-to-source voltage (Vds) 406 versus the observed drain-to-source current (Ids) 404 of a PMOS folded-gate transistor in the ON STATE 408. As can be seen in the ON STATE I-V graph 400, the observed effects of damage increase (i.e., accumulate) with the number of stress cycles 410 applied to the transistor Vds. A large fraction of the increased current observed in the ON STATE I-V graph 402 for increasing number of stress cycles 410 is due to increased gate-to-drain breakdown. The increased damage is desirable in order to permit programming/"burn-in" of transistors in the ON STATE 408.

Figure 4B:
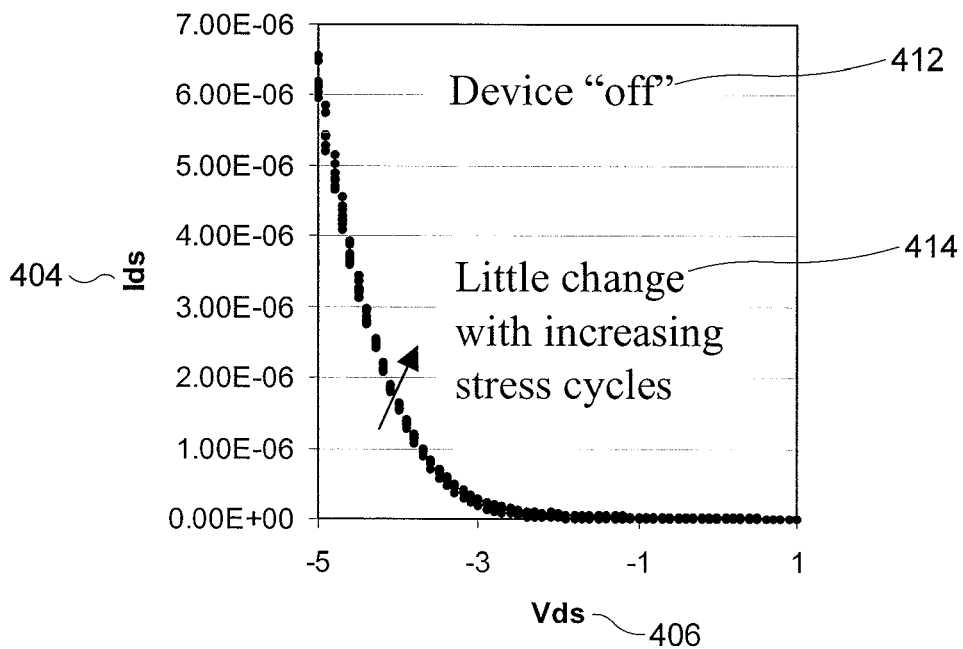
FIG. 4B is a graph of experimental current-voltage (I-V) characteristics of a PMOS folded-gate transistor when cycling the voltage beyond the ON STATE trigger voltage ($V_{TR}$) for a transistor in the "OFF" state.

FIG. 4B is a graph 402 of experimental current-voltage (I-V) characteristics of a PMOS folded-gate transistor when cycling the voltage close to the ON STATE trigger voltage ($V_{TR}$) for a transistor in the "OFF" state 412. Each cycle ramps the drain voltage between −5V and 1V. The OFF STATE I-V graph 402 shows the results of 9 cycles between −5V and 1V for a PMOS folded gate transistor (described in the disclosure with respect to FIGS. 3A & B) in the OFF STATE 412. As can be seen in the OFF STATE I-V graph 402, the observed effects of damage change little 414 with the number of stress cycles applied to the transistor Vds. The lack of damage is likely due to the lower degree of "turning-on" of the parasitic bipolar device owing to the lower injected current in the substrate of the transistor when the transistor is in the OFF STATE 412. The lack of damage is desirable to prevent programming/"burn-in" of transistors in the OFF STATE 412 so that a transistor programmed in the OFF STATE 412 may be differentiated from a transistor programmed in the ON STATE 408.

Figure 5:
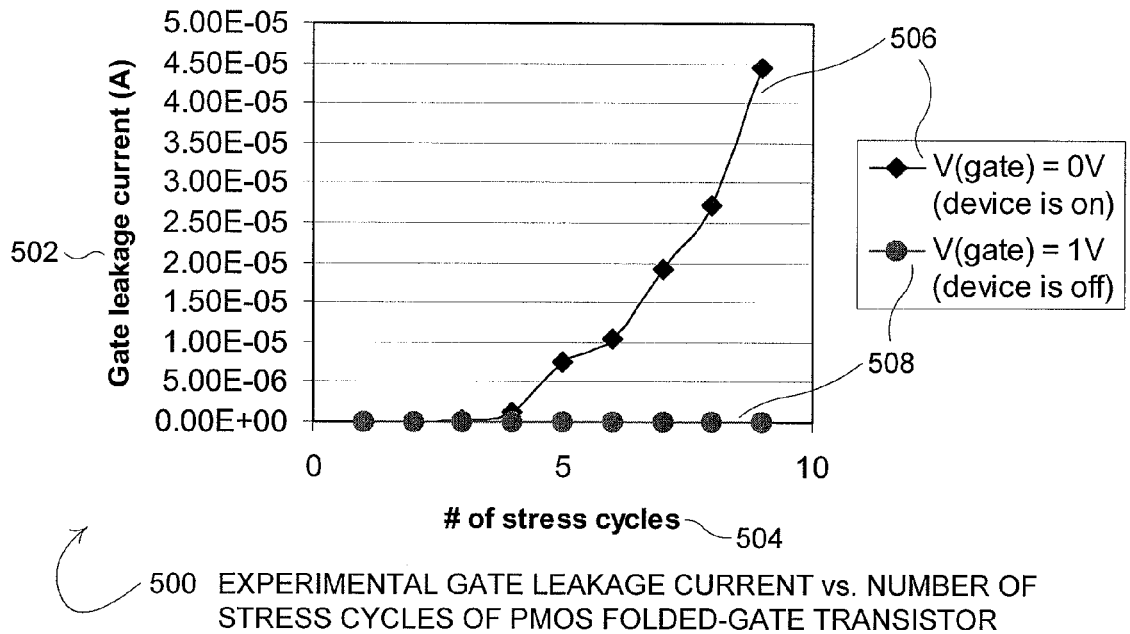
FIG. 5 is a graph of the experimentally observed gate leakage current as a function of the number of stress cycles of a PMOS folded-gate transistor for two cases, where the PMOS device is in an "ON" state and where the PMOS device is in an "OFF" state.

FIG. 5 is a graph 500 of the experimentally observed gate leakage current 502 as a function of the number of stress cycles 504 of a PMOS folded-gate transistor for two cases; 1) where the PMOS device is in an "ON" state 506, and 2) where the PMOS device is in an "OFF" state 508. For both cases 506 (ON STATE) and 508 (OFF STATE), the absolute value of the drain-to-gate voltage (Vdg) of the transistor is set to 1V. As seen in the gate leakage current graph 500, the gate-to-drain leakage current (Idg) 502 goes up with repeated stress cycles for the case where the transistor is in the ON STATE 506. The observed increase in the gate leakage current 502 is consistent with a break down of the MOS transistor device. Thus, the ON STATE 506 transistor breaks down and shorts out as is desired for programming/"burn-in." As also seen in the gate leakage current graph 500, the gate-to-drain leakage current (Idg) 502 has very little change with repeated stress cycles for the case where the transistor is in the OFF STATE 508. The observed lack of change in the gate leakage current 502 is consistent with the MOS transistor device not breaking down. Thus, the OFF STATE 508 transistor does not break down and does not short out as is desired for programming/"burn-in" of OFF STATE transistors.

Figure 6:
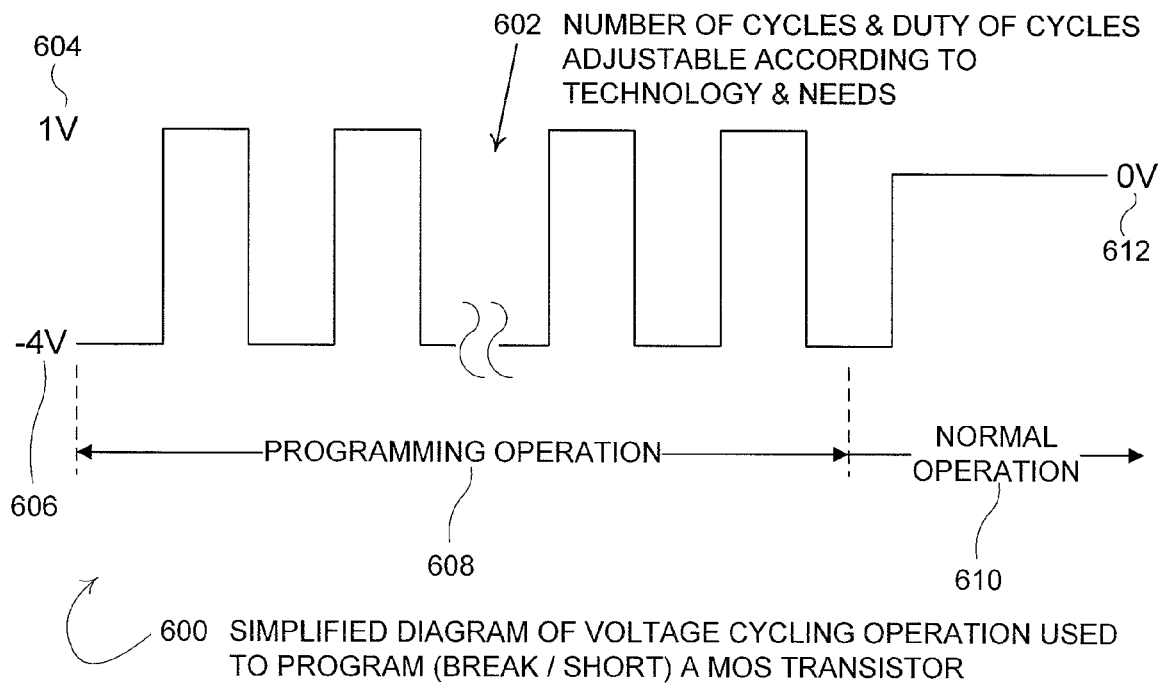
FIG. 6 is a simplified diagram of a voltage cycling operation used to program (break/short) a MOS transistor.

FIG. 6 is a simplified diagram 600 of a voltage cycling operation used to program (break/short) a MOS transistor. The voltage value indicated in the cycle diagram 600 represents the voltage cycles applied to the drain of the MOS transistors via the programming Power Line (PL) in the programming circuit of an SRAM-based OTP cell. The voltage values shown in FIG. 6 are for the 90 nm process technology example discussed throughout this disclosure. Different implementations of MOS technology may have different voltage values as determined by the specific construction of the different MOS transistors. During the programming operation 608, the applied voltage is cycled between −4V (606) and 1V (604). At 602, it is specified that the number and duration (i.e., duty) of the cycles may be adjusted according to the needs of the technology and the observed results of the programming operation. The −4V (606) voltage represents the programming voltage 606 that causes Vds to approach the trigger voltage ($V_{TR}$) (in terms of absolute value) and stresses an ON STATE transistor such that the ON STATE transistor breaks down and shorts out. The 1V (604) voltage represents a secondary non-stressing voltage 604. In the embodiment described in FIG. 6, the secondary non-stressing voltage 604 is connected to 1V or Vdd (HIGH data value). In other embodiments, the secondary non-stressing voltage 604 may be grounded (i.e., 0V), Vss (LOW data value, often ground), or some other voltage value that is less stressing to the transistor than the programming voltage (−4V) (606). In the embodiment described in FIG. 6, the programming Power Line (PL) is connected to 0V (604) (i.e., ground or Vss) during normal operation 610. Other embodiments may connect the programming Power Line (PL) to Vdd during normal operation 610. Where the programming circuit uses PMOS (as described in the disclosure with respect to FIG. 7), it may be necessary to load a complement of the intended data set prior to programming when the programming Power Line (PL) is connected to Vdd during normal operation as the using Vdd instead of ground connection during normal operation effectively reverses the logic of the programming circuit. A system using NMOS (put in the ON STATE when the complement/inverse data value—a HIGH/1 data value—is applied to the gate as for PMOS) would have a normal data set for programming when the programming Power Line (PL) is connected to Vdd during normal operation and would need a complementary data set when the programming Power Line (PL) is connected to ground during normal operation since NMOS gate logic is opposite that of PMOS gate logic.

Figure 7:
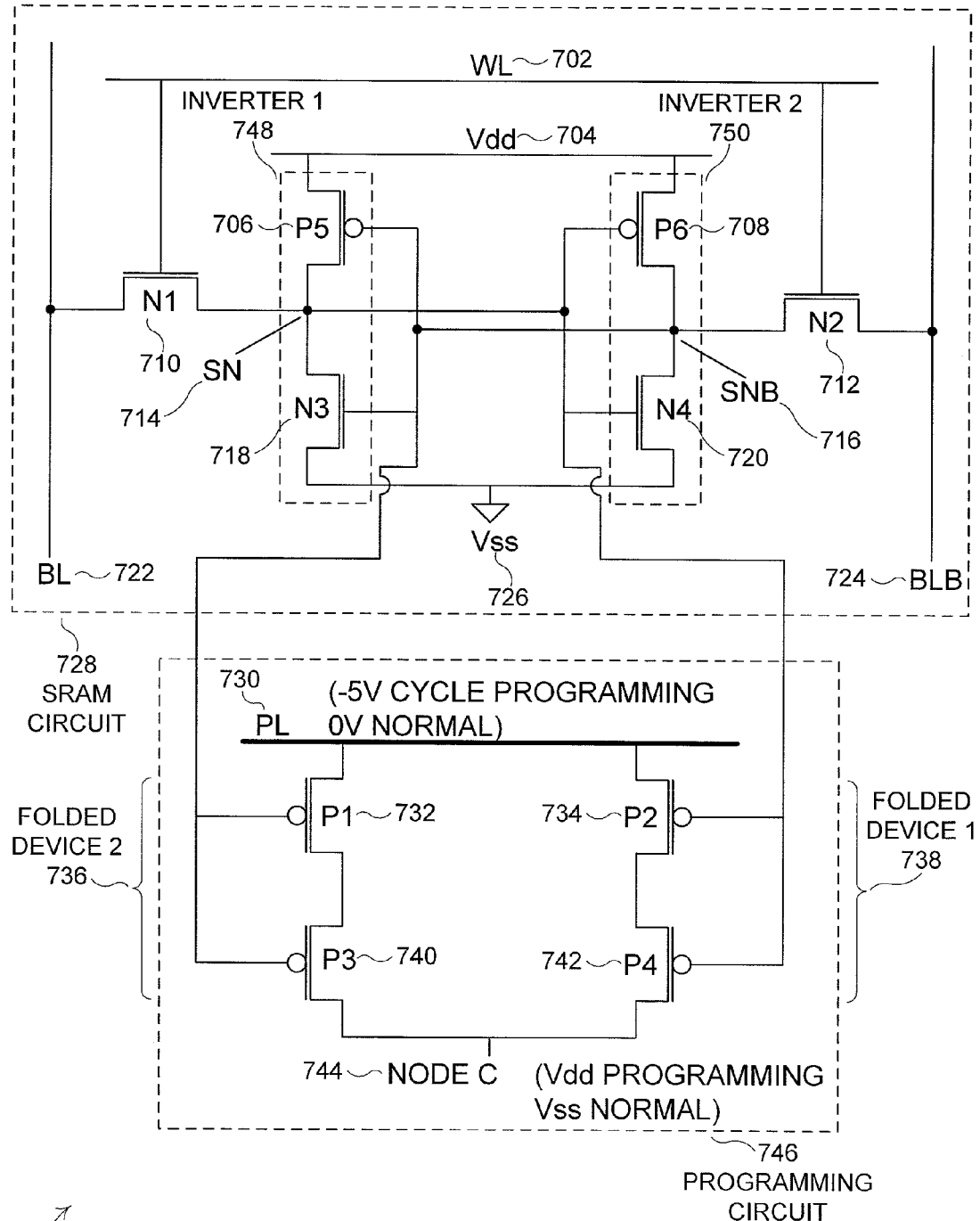
FIG. 7 is a schematic diagram of an embodiment of a One-Time-Programmable (OTP) memory cell circuit.

FIG. 7 is a schematic diagram of an embodiment of a One-Time-Programmable (OTP) memory cell circuit 700. Using the break down (short out) characteristics for a MOS transistor in the ON STATE and the non-break down characteristics for a MOS transistor in the OFF STATE, it is possible to modify a standard six transistor (6T) SRAM bitcell 728 with a programming circuit 746 to create an SRAM-based OTP memory cell circuit 700. For the embodiment illustrated in FIG. 7, the programming circuit 746 is comprised of two folded-gate PMOS transistors (736, 738). Each folded-gate PMOS transistor 736, 738 is represented by two PMOS transistors (732, 740 and 734, 742) in the schematic. Folded gate PMOS transistor 1 (738) is represented by PMOS transistors P2 (734) and P4 (742). Folded-gate PMOS transistor 2 (736) is represented by PMOS transistors P1 (732) and P3 (740). Both folded-gate transistor 1 (738) and folded-gate transistor 2 (736) are connected from drain-to-source between the programming Power Line (PL) 730 and node C 744. The gate electrodes of the transistors P2 (734) and P4 (742), which are folded device 1 (738), of the programming circuit 746 are connected to node SN 714 of the SRAM cell circuit 728. The gate electrodes of the transistors P1 (732) and P3 (740), which are folded device 2 (736), of the programming circuit 746 are connected to node SNB 716 of the SRAM cell circuit 728. Electrical node SN 716 of the SRAM cell circuit 728 represents the "normal" value of the data stored in the SRAM circuit cell 728. Electrical node SNB 716 represents the "complementary" (aka. "opposite" or "inverse") value of node SN 714, and when the SRAM circuit cell 728 is in a stable state, node SNB 716 will be at the opposite data voltage (HIGH/LOW) of node SN 716. Therefore, when programming one half of the programming circuit 746, either folded device 1 (738) or folded device 2 (736), will be in an ON STATE. The other half of the programming circuit will be in an OFF STATE. Hence, when the circuit is programmed either folded device 1 (738) or folded device 2 (736) will be broken down (i.e., shorted out), but not both folded devices 736, 738.

The SRAM cell circuit 728 portion of the OTP cell circuit 700 is comprised of a standard six transistor (6T) SRAM bitcell circuit. The primary storage functionality of the SRAM cell circuit 728 is provided by the two cross coupled inverters 748, 750. Each inverter 748, 750 is comprised of a PMOS transistor connected in series from drain-to-source between Vdd 704 (HIGH data state, typically 1V for 90 nm process technology) and Vss 726 (LOW data state, typically ground or 0V for 90 nm process technology). Inverter 1 (748) is comprised of PMOS transistor P5 (706) and NMOS transistor N3 (718). Inverter 2 (750) is comprised of PMOS transistor P6 (708) and NMOS transistor N4 (720). To achieve the cross-coupling necessary to store data in the SRAM cell circuit 728, the output of inverter 1 (748), which is node SN 714, is connected to the gate inputs of inverter 2 (750), and the output of inverter 2 (750), which is node SNB 716, is connected to the gate inputs of inverter 1 (748). Due to the cross-coupling of the inverters 748, 750, the only stable states for the SRAM cell circuit 728 are when nodes SN and SNB are in opposite or complementary data states (i.e., HIGH/LOW or LOW/HIGH). Node SN 714 represents the data state of the SRAM cell circuit 728 and node SNB 716 represents the complementary data state of the SRAM cell circuit 728.

Node SN 714 is connected to the Bit Line (BL) 722 through NMOS transistor N1 (710). Node SNB is connected to the complementary Bit Line (BLB) 724 through NMOS transistor N2 (712). The gates of both N1 (710) and N2 (712) are connected to the Word Line (WL) 702. Thus, when WL 702 is asserted (i.e., set to Vdd), both N1 (710) and N2 (712) are put into an ON STATE, causing node SN 714 to be electrically connected to BL 722 and node SNB 716 to be electrically connected to complementary Bit Line BLB 724. When WL 702 is de-asserted (i.e., set to Vss/0V), both N1 (710) and N2 (712) are put in an OFF STATE causing node SN 714 to be electrically disconnected from BL 722 and node SNB 716 to be electrically disconnected from BLB 724. To write to the SRAM cell circuit 728, BL 722 and BLB 724 are set to opposite values (i.e., HIGH/LOW or LOW/HIGH) and WL 702 is asserted. Since the values of BL 722 and BLB 724 represent a stable data state and the relative power behind BL 722 and BLB 724 is stronger than the current state of the transistors in the SRAM cell circuit 728, the nodes SN 714 and SNB are forced to the states of BL 722 and BLB 724, respectively. For a read operation, BL 722 and BLB 724 are precharged to equivalent values and the current state of SN 714 and SNB 716 force BL 722 and BLB 724 to a stable state matching the state of SN 714 and SNB 716, respectively when WL 702 was asserted. If either SN 714 or SNB 716 is shorted to ground or Vdd 704, the write operation for the SRAM cell circuit 728 will no longer work because the short forces either node SN 714 or SNB 716 to a fixed data state that cannot be changed by the write operation and the complimentary node will need to be the opposite data value to place the SRAM cell circuit 728 into a stable state.

The programming circuit transistors P1-4 (732, 734, 740, 742) may be narrow width PMOS devices which consume minimal area and do not play a role in SRAM bitcell 728 performance. Transistors P1 (732) and P3 (740) may be laid out as folded-gate device 2 (736) and transistors P2 (734) and P4 (742) may be laid out as folded-gate device 1 (738). The physical layout of the folded-gate devices 736, 738 may necessitate that the folded-gate devices 736, 738 be formed on a separate piece of diffusion from the SRAM cell circuit 728 to ensure that desired damage to the programming circuit 746 transistors is physically separated from the SRAM cell circuit 728 transistors. The programming circuit 746 also requires a connection to a programming Power Line (PL) 730 that supplies the programming voltage to the programming circuit 746 transistors during the programming process of the OTP cell circuit 700. The transistors in the programming circuit 746 are also connected to node C 744. Multiple OTP cell circuits 700 may be combined to create an OTP memory array. The number of OTP cell circuits 700 in the OTP memory array is determined by the desired memory size for a desired data set. The programming Power Line (PL) 730 and node C 744 may be common to all OTP cell circuits 700 in the OTP memory array so that all OTP cell circuits 700 in the OTP memory array may be programmed concurrently by properly adjusting the voltage applied to the programming Power Line (PL) 730 and node C 744. During normal operation the programming Power Line (PL) 730 and node C 744 are connected to an equivalent voltage so that if the transistors of the programming circuit 746 are broken down and shorted out (i.e., programmed or "burned-in") there is not a voltage differential between the programming Power Line (PL) 730 and node C 744 and the SRAM circuit cell 728 is forced to the value dictated by the shorted out folded-gate transistor of the programming circuit 746. For the embodiment illustrated in FIG. 7, a connection to ground (0V) for PL 730 and node C 744 during normal operation means that the associated SRAM cell circuit 728 would need to hold the desired data value to be programmed into the OTP cell circuit 700 when the OTP memory array is programmed. If PL 730 and node C 744 are instead connected to Vdd 704 (1V) during normal operation, the SRAM cell circuit 728 would need to hold the complement of the desired end data value to be programmed into the OTP cell circuit 700. Whether PL 730 and node C 744 are connected to Vdd 704 (1V) or to ground/Vss 726 (0V) does not affect the process of programming the program circuit 746.

According to the MOS transistor characteristics described with respect to FIGS. 1-5, the programming process involves applying a programming voltage to the programming Power Line (PL) 730 and applying Vdd (1V) 704 to node C 744. The voltage difference between PL 730 and node C 744 during the programming process approaches the trigger voltage ($V_{TR}$) of the parasitic bipolar junction transistor within the folded-gate devices 736, 738 of the programming circuit 746. For 90 nm process technology, the programming voltage applied to PL 730 during a programming cycle would likely fall between −4V and −5V. To supply power to PL 730 for programming operations, the system may provide an external "pin" connection to allow an external source to supply the programming voltage. Alternatively, an internal power supply may be constructed with charge pumps to supply the necessary voltage (similar to how power is supplied for many Flash-based non-volatile memories). In one embodiment, the programming voltage may be a fixed value determined by the OTP memory array manufacturer or other knowledgeable party. In other embodiments, the programming voltage may be adjustable by the user so that a user may adjust the programming voltage as desired to achieve proper programming of the OTP array. Prior to programming the desired data set should be loaded into the SRAM circuit cells 728 and verified by reading the SRAM circuit cells 728. Depending on whether PL 730/node C 744 are connected to ground or Vdd 704 during normal operation, the desired data set loaded for programming may need to be the complement of the final desired data state of the programmed OTP memory array. Hard wiring node C 744 to Vdd 704 may save some layout area for the overall OTP memory array circuit since node C 744 will not need to change between ground (normal operation) and Vdd (programming operation), but the hardwiring of node C 744 to Vdd 704 will likely require that the preprogramming state the SRAM cell circuits 728 be the complement of the final desired data state of the OTP cell circuits 700.

Programming the OTP memory array may be achieved by applying a large voltage (absolute value) to PL 730 in order to cause the folded device 736 or 738 currently put in an ON STATE by the current logic state of the SRAM cell circuit 728 to break down and short out. As described above, it may be desirable to use a lower programming voltage and repeat a number of cycles between the programming voltage and a secondary non-stressing voltage to achieve more controllable and reliable programming results. The folded device 736, 738 not put in the ON STATE by the SRAM cell circuit logic state does not break down and does not short out, ensuring that only one of SN 714 and SNB 716 will be shorted to PL 730/node C 744 during normal operation. Thus, after programming, in accordance with the data state of the SRAM cell circuit 728 prior to programming, either SN 714 or SNB 716 is shorted to PL 730/node C 744. Therefore, the SRAM cell circuit 728 is forced to a specific data state matching the pre-programming data state of the SRAM cell circuit 728 due to the broken down (i.e., shorted out) folded-gate device of the programming circuit 746. Multiple OTP cells 700 of an OTP memory array may be programmed concurrently by utilizing a common programming Power Line (PL) 730 and node C 744 between the multiple OTP cells 700 of the memory array.

Depending on the size of the OTP memory array, the programming current needed to supply PL 730 during programming operations may be very large. To control the amount of current supplied to PL 730 during programming operations it may be desirable to segment the OTP memory in order to have two or more PL 730 nodes. It may also be possible to lower the programming current supplied to PL 730 by lowering the programming voltage, but this is limited by the need to keep the drain-to-source voltage (Vds) differential of the programming circuit close to the trigger voltage ($V_{TR}$) of the parasitic bipolar junction transistor contained within the MOS transistors of the programming circuit 746. If the programming voltage is lowered, it may also be necessary to increase the number of cycles used in a repeated stress operation of a programming process. Segmenting the OTP memory array into multiple, sub-memory array segments may also permit alternate uses for the various sub-memory array segments. Each sub-memory array segment may operate as an individual OTP memory where the sub-memory array segments are packaged together to form a combined, large OTP memory array. Each sub-memory array segment may be programmed individually since each sub-memory array segment has a separate programming Power Line PL 730. Therefore, each sub-memory array segment may be programmed at different times. Further, since each sub-memory array segment is based on fully functional SRAM technology, each sub-memory array segment may be utilized as standard SRAM memory until the sub-memory array segment is programmed. For example, a 4 MB OTP memory array may be broken down into four 1 MB sub-memory array segments. If a program application requires 1 MB of storage space, the program may be stored in by programming a first sub-memory array segment of the OTP memory array. The remaining three sub-memory array segments may be used as SRAM volatile memory storage for applications with access to the large OTP memory array. If, in the future, it is desired to load a second program (or other permanently stored data), a second sub-memory array segment may be programmed, leaving two sub-memory array segments to be used for volatile memory storage. Various combinations of sub-memory array segment sizes as well as overall OTP memory array size may be implemented as desired. The sub-memory array segment sizes may vary within the same overall OTP memory array.

After programming the OTP memory array, the OTP memory array may be physically turned OFF and then back ON. During the power-up (aka. start-up) process it may be possible that a small fraction of OTP memory cells 700 may not appear ("wake-up") in the proper programmed state. To ensure that the OTP memory cells 700 of the OTP memory array "wake-up" holding the correct data state, the power supply may be ramped at a controlled, slower rate for the SRAM cell circuit 728 where the SRAM cell circuit 728 power ramp up takes place after that for node PL 730 and node C 744. Hence, the programming circuit 746 is powered up first so that whichever of folded device 1 (738) or folded device 2 (736) is shorted out will be operational and at a steady state prior to the SRAM cell circuit 728 being powered up. Accordingly, the programming circuit 746 may control the initial "wake-up" state of the SRAM cell circuit 728.

An example scenario might have node SN 714 at a '1' (HIGH) data value and, correspondingly, have node SNB 716 at a '0' (LOW) data value. Node C 744, which is connected to the source of the folded-gate PMOS transistors of the programming circuit 746, may be held at Vdd 744 (1V) during the programming operation. The OTP memory cell circuit 700 may then be programmed by cycling PL 730 between 1V and –X volts, where –X may be a voltage value chosen by the programmer (typically –4V). Devices P1 (732) and P3 (740) are in an ON STATE because the gates of the devices 732, 740 are connected to SNB 716 which is currently '0' (LOW) and a PMOS transistor is put in an ON STATE when the gate voltage is 0V, which corresponds to a digital '0' data value. Devices P2 (732) and P4 (740) are in an OFF STATE because the gates of the devices 734, 742 are connected to SN 714 which is currently '1' (HIGH) and a PMOS transistor is put in an OFF STATE when the gate voltage is 1V, which corresponds to a digital '1' data value. Since devices P1 (732) and P3 (740) are in an ON STATE, the cycling of the voltage of node 'PL' 730 will cause an electrical short to develop between nodes PL 730 and SN 714. Correspondingly, because P2 (734) and P4 (742) are in an OFF STATE, no short develops between node PL 730 and SNB 716. After programming is completed, node PL 730 is returned to 0V (i.e., grounded). Node C 744 is also grounded (otherwise there will be significant current leakage between node C 744 and node SN 714). Thus, the OTP memory cell 700 is now permanently programmed with node SN 714 being connected via a low resistive path to 0V (ground). Such a permanent programming takes place either on node SN 714 or node SNB 716, depending on the data states of the respective SRAM cell circuit 728. Thus, after programming is completed and the power to the OTP memory array is turned OFF and then back ON, each OTP memory cell 700 of the OTP memory array now boots up in the programmed state.

Various embodiments may implement the OTP memory cell circuit differently than illustrated in FIG. 7. Embodiments may utilize NMOS instead of PMOS transistors for the programming circuit. Due to the fact that hot carrier effects are higher for NMOS devices, plus the fact that the inversion-gate thickness is often thinner for NMOS devices, it is likely that the destructive break down voltage (i.e., the trigger voltage $V_{TR}$) may occur at a lower drain voltage for NMOS transistors than for PMOS transistors of similar technology/material characteristics. The details of the programming process for NMOS transistors is qualitatively the same as for PMOS transistors, but there may be some specific adjustments made for the gate logic differences of NMOS devices. As discussed above, some programming and normal operation states may need to be adjusted to accommodate the fact that NMOS transistors are put in an ON STATE by the opposite voltage being applied to the gate as for PMOS devices. Thus, it may be necessary to load complementary logic prior to programming in order to obtain the desired data set in the OTP memory array after programming is complete. Alternatively, the programming Power Line (PL) and the third node C may be connected to Vdd instead of to ground during normal operation. Various embodiments may connect the programming Power Line (PL) and the third node C to Vdd instead of ground during normal operation. Also, the programming voltage applied to the drain of an NMOS device will need to be positive rather than negative as it is for a PMOS device. Various embodiments may utilize more than one folded-gate MOS transistor for each half of the programming circuit, as desired by the system designer. It may be necessary to adjust the programming voltage applied to the programming Power Line (PL) to properly program a circuit with more than one folded-gate MOS transistor in each half of the programming circuit. Similarly, various embodiments may use one or more normal, "non-folded" MOS transistors for each half of the programming circuit. Various embodiments may utilize a different logical implementation of a 6T SRAM circuit. Further, various embodiments may utilize non-6T SRAM bitcell technology where a connection to an electrical node representing the intended data value and a connection to an electrical node representing the complementary (opposite) data value are available for connecting to the programming circuit. Various embodiments may also utilize other types of volatile (i.e., RAM) memory as the core memory circuit of the embodiment. Other volatile (RAM) memory structures that have both a logic state node and a complementary logic state node in the bitcell circuitry may utilize the programming circuit described in this disclosure and connected to the appropriate logic/complementary logic nodes to force the logic/complementary logic nodes to "programmed" values in a similar fashion as for the 6T SRAM circuit described herein.

Figure 8:
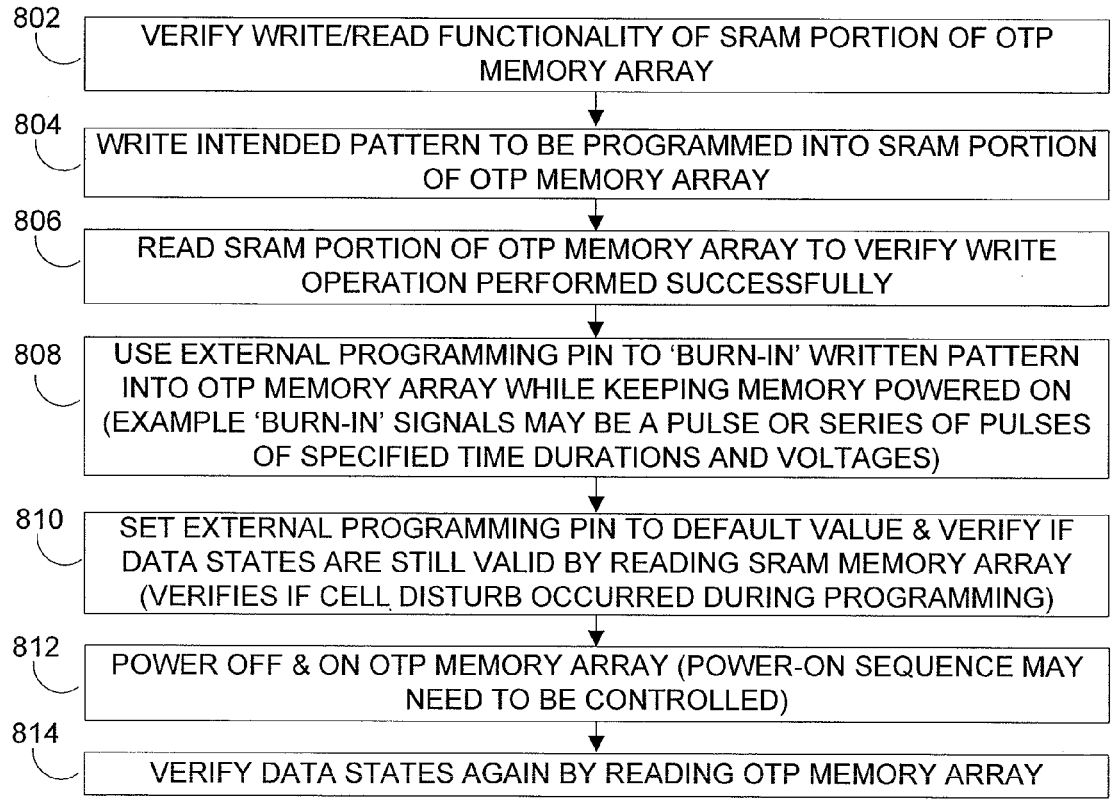
FIG. 8 is a flow chart describing the programming for an embodiment of an OTP memory array.

FIG. 8 is a flow chart describing the programming for an embodiment of an OTP memory array. At 802, the system verifies the read and write functionality of the SRAM portion of the OTP memory array with standard memory verification test procedures for SRAM memory arrays. At 804, the intended data pattern for programming the OTP memory array is written into the SRAM portion of the OTP memory array. At 806, the SRAM portion of the OTP memory array is read and compared to the data pattern written to the OTP memory array to verify that the write operation was successful. At 808, an external programming pin of the OTP memory array is used to "burn-in" the current state of the SRAM portion of the OTP memory array. The memory maintains power during the programming operation so that the volatile SRAM portion of the memory array does not lose the stored data state while the programming process is in progress. As described above, the "burn-in" signal may be a pulse or series of pulses of a programming voltage for specified time durations and programming voltages. The specified time durations and programming voltages may be specified by the OTP memory array manufacturer and/or the values may be specified by the user programming the OTP memory array. While the embodiment described utilizes an eternal power supply and external pin to power the programming voltage, other embodiments may power the programming voltage via other power supply technologies and methods (e.g., an embodiment may use an internal power supply constructed of charge pumps). At 810, the external programming pin is set to the default (i.e., normal) value and the success of the programming is verified by reading the OTP memory array and comparing what was read to the desired data set for the OTP memory array. The data verification in 810 verifies if a memory cell was disturbed during the programming process resulting in an incorrect data set stored in the OTP memory array. At 812, the OTP memory is powered OFF and back ON. As described above, the power-on sequence may need to be controlled and slowed down to ensure that the OTP memory cells "wake-up" in the correct state. At 814, the OTP memory array read is read again and the results are compared to the desired data set for the OTP memory array for verification of the programming process.

Various embodiments provide a number of advantages over other OTP technology. The electrical characteristics of the OTP memory array of the various embodiments matches the speed of standard SRAM since the memory storage aspect of the various embodiments is based on SRAM technology. For applications that use shadow-RAM combined with OTP memory, various embodiments offer a size advantage over the combined size required for a typical OTP memory and a duplicate set of shadow-RAM. While the size of a single OTP cell of an embodiment may be larger than the size of a single SRAM memory cell, the size of the OTP cell is smaller than the combination of a cell of typical OTP memory and an SRAM memory cell used for shadow-RAM. Since the data storage portion of the OTP cells of the various embodiments is based on standard SRAM technology, the external writing, control and sensing circuitry is the same as for standard SRAM technology, which is relatively standard in the industry. Various embodiments may be programmed using a single external programming voltage pin providing a relatively easy and simple OTP memory programming system. Various embodiments may be "field" programmable if an internal power source is provided for the programming voltage and/or if an appropriate voltage supply is available to provide the programming voltage to the external programming power pin. The programming method for the various embodiments does not rely on achieving a specified value of leakage or leakage distribution in the programmed element. Instead, the various embodiments only require that there is sufficient asymmetry induced in the SRAM cell via leakage to impart a reproducible preferred state for the SRAM cell. Once the SRAM cell attains the programmed preferred state, no additional leakage is required. Even though the programming method for various embodiments may make use of repeated stressing to induce gate oxide damage in the program circuit transistors, the gates in the OTP cell are diode protected due to the cross-coupling within the SRAM cell portion of the OTP circuit. Additionally, for embodiments using PMOS transistors in the programming circuit, because the programming voltage is negative, the voltage state of the gate of the "damaged" device is reinforced. Therefore, the chances of a bit (SRAM cell) being upset during programming is minimized. Also, any excessive currents flowing to the gate node are shunted by the presence of the above-described diode connections of the cross-coupled SRAM cell. Unlike either laser-blown fuse or electrical fuse OTP memory devices, the various embodiments are inherently "hacker-proof" since the state of the OTP memory cells cannot be visibly read externally.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of providing high-speed One-Time-Programmable (OTP) memory comprising:

providing a Static Random Access Memory (SRAM) cell circuit using Metal-Oxide Semiconductor (MOS) type transistors said SRAM cell circuit having a first electrical node SN and a second electrical node SNB, said MOS type transistors having two predetermined voltage ranges corresponding to data values of LOW and HIGH in accordance with characteristics of MOS transistor technology used to create said MOS type transistors, said first electrical node SN having a node SN voltage value corresponding to a SN data value, said second electrical node SNB having a node SNB voltage value corresponding to a SNB data value, and said SNB data value being a complementary data value of said SN data value;

providing a Vdd voltage corresponding to a HIGH target voltage for said HIGH data value;

providing a Vss voltage corresponding to a LOW target voltage for said LOW data value;

providing a plurality of damageable MOS type transistors that have equivalent voltage ranges for said LOW and HIGH data values as said SRAM cell circuit MOS type transistors, said plurality of damageable MOS type transistors having gates, drains, and sources, said damageable MOS transistors further having characteristic parasitic bipolar junction transistors present within said damageable MOS transistors that causes said damageable MOS transistors to break down and short out when a burn-in voltage that approaches a trigger voltage $V_{TR}$ of said damageable MOS transistors is applied across said drains and said sources of said damageable MOS transistors when said damageable MOS transistors are in an ON STATE but not when said damageable MOS transistors are in an OFF STATE, said trigger voltage $V_{TR}$ of said damageable MOS transistor being a voltage matching a position on a characteristic current to voltage curve of said damageable MOS technology characteristics where a snapback characteristic of said characteristic parasitic bipolar junction transistors appears on said characteristic current to voltage curve when said damageable MOS transistors are in said ON STATE, said ON STATE and said OFF STATE of said damageable transistors being controlled by a gate voltage applied to said gates of said damageable MOS transistors in accordance with damageable MOS technology characteristics of said damageable MOS type transistors, when said damageable MOS transistors are in said ON STATE current flow between said drains and said sources of said damageable MOS transistors is permitted, when said damageable MOS transistors are in said OFF STATE current flow between said drains and said sources of said damageable MOS transistor is substantively not permitted;

providing a programming circuit that has a first group of MOS transistors and a second group of MOS transistors, said first group of MOS transistors and said second group of MOS transistors being comprised of subsets of said plurality of damageable MOS type transistors, said first group of MOS transistors comprising at least one damageable MOS transistor, said gates of said first group of MOS transistors being connected to said first electrical node SN of said SRAM cell, said drains and said sources of said first group of MOS transistors being connected in series between a programming Power Line PL and a third electrical node C, said second group of MOS transistors comprising at least one damageable MOS type transistor, said gates of said second group of MOS transistors being connected to said second electrical node SNB of said SRAM cell, said drains and said sources of said second group of MOS transistors being connected in series between said programming Power Line PL and said third electrical node C;

combining said SRAM cell circuit and said programming circuit as an OTP cell circuit;

powering said OTP cell circuit such that said SRAM cell circuit is operational and said programming Power Line PL and said third electrical node C are at a normal operation equivalent voltage level;

storing a desired data value in said SRAM cell circuit such that said electrical node SN is at said desired data value and said electrical node SNB is at said complementary data value of said desired data value;

programming said programming circuit to a programmed state by connecting said third electrical Node C to said Vdd voltage and by applying a programming voltage to said programming Power Line PL, said programming voltage being a voltage that causes said voltage differential between said programming Power Line PL and said third electrical node C to substantively be said burn-in voltage, thereby causing whichever of said first group of MOS transistors and said second group of MOS transistors is in said ON STATE to break down and short out, which of said first group of MOS transistors and said second group of MOS transistors is in said ON STATE being determined by said SN data value connected to said gates of said first group of MOS transistors and said SNB data value that is said complementary data value of said SN data value connected to said gates of said second group of MOS transistors of said SRAM cell circuit; and setting said programming Power Line PL and said third electrical node C to said normal operation equivalent voltage level applied prior to said programming such that whichever of said first group of MOS transistors connected to electrical node SN of said SRAM cell circuit and said second group of MOS transistors connected to said electrical node SNB of said SRAM cell circuit was broken down and shorted out during programming to electrically connect said respective electrical node SN or said electrical node SNB of said SRAM cell circuit to said normal operation equivalent voltage level of said electrical node C and said programming Power Line PL, thereby forcing said respective electrical node SN or electrical node SNB to correspond to said HIGH or LOW data value corresponding to said normal operation equivalent voltage level of said electrical node C and said programming Power Line PL regardless of attempts to write a different data value to said SRAM cell circuit.

2. The method of claim 1 further comprising:

providing a plurality of said OTP cell circuits to create an OTP memory array such that said OTP memory array provides a desired amount of OTP memory storage; and, connecting each programming circuit of said OTP memory array to a common programming Power Line PL and a common third electrical node C such that said plurality of said OTP cell circuits are programmed concurrently by said programming voltage applied to said programming Power Line PL.

3. The method of claim 2 further comprising:
providing a plurality of said OTP memory arrays such that each OTP memory array of said plurality of memory arrays has a separate common programming Power Line PL such that each OTP memory array of said plurality of memory arrays may be programmed independently of other memory arrays in said plurality of memory arrays;
programming a first subset group of OTP memory arrays of said plurality of OTP memory arrays to permanently store a desired data set; and,
operating a second subset group of OTP memory arrays of said plurality of memory arrays as standard SRAM volatile memory.

4. The method of claim 1 wherein said programming process further comprises:
cycling voltage applied to said programming Power Line PL between said programming voltage and secondary non-stressing voltage for a predetermined number of cycles at a predetermined length for each cycle, said predetermined number of cycles and said predetermined length for each cycle determined according to said damageable MOS technology characteristics.

5. The method of claim 4:
wherein said secondary non-stressing voltage is one of the group comprising: said Vdd voltage, said Vss voltage, electrical ground, and zero volts; and,
wherein said normal operation equivalent voltage is one of the group comprising: said Vdd voltage, said Vss voltage, and electrical ground.

6. The method of claim 4 wherein said burn-in voltage that approaches said trigger voltage $V_{TR}$ of said damageable MOS transistors is substantively within one volt of reaching said trigger voltage $V_{TR}$.

7. The method of claim 1:
wherein said damageable MOS transistors used in said programming circuit are folded-gate devices;
wherein said SRAM cell circuit is placed on a separate piece of diffusion from said programming circuit; and,
wherein channel types of said damageable MOS transistors used in said programming circuit are one of the group comprising: p-channel (PMOS) and n-channel (NMOS).

8. The method of claim 1 further comprising:
powering down said OTP cell circuit; and,
powering said SRAM cell circuit by ramping up a power supply at a controlled slower rate than that for said programming circuit such that said SRAM cell circuit is powered up after said programming circuit and said SRAM cell circuit returned to said programmed state on OTP cell circuit start-up.

9. The method of claim 1 wherein said SRAM cell circuit is a volatile memory cell circuit based on a non-SRAM circuit structure that has electrical nodes that substantively correspond to said electrical node SN at said SN data value and said electrical node SNB at said complementary data value of said SN data value and are connected to said programming circuit as are said electrical node SN and said electrical node SNB.

10. A One-Time-Programmable (OTP) memory device comprising:
a Static Random Access Memory (SRAM) cell circuit using Metal-Oxide Semiconductor (MOS) type transistors said SRAM cell circuit having a first electrical node SN and a second electrical node SNB, said MOS type transistors having two predetermined voltage ranges corresponding to data values of LOW and HIGH in accordance with characteristics of MOS transistor technology used to create said MOS type transistors, said first electrical node SN having a node SN voltage value corresponding to a SN data value, said second electrical node SNB having a node SNB voltage value corresponding to a SNB data value, and said SNB data value being a complementary data value of said SN data value;
a Vdd voltage corresponding to a HIGH target voltage for said HIGH data value;
a Vss voltage corresponding to a LOW target voltage for said LOW data value;
a plurality of damageable MOS type transistors that have equivalent voltage ranges for said LOW and HIGH data values as said SRAM cell circuit MOS type transistors, said plurality of damageable MOS type transistors having gates, drains, and sources, said damageable MOS transistors further having characteristic parasitic bipolar junction transistors present within said damageable MOS transistors that causes said damageable MOS transistors to break down and short out when a burn-in voltage that approaches a trigger voltage $V_{TR}$ of said damageable MOS transistors is applied across said drains and said sources of said damageable MOS transistors when said damageable MOS transistors are in an ON STATE but not when said damageable MOS transistors are in an OFF STATE, said trigger voltage $V_{TR}$ of said damageable MOS transistors being a voltage matching a position on a characteristic current to voltage curve of said damageable MOS technology characteristics where a snapback characteristic of said characteristic parasitic bipolar junction transistors appears on said characteristic current to voltage curve when said damageable MOS transistors are in said ON STATE, said ON STATE and said OFF STATE of said damageable transistors being controlled by a gate voltage applied to said gates of said damageable MOS transistors in accordance with damageable MOS technology characteristics of said damageable MOS type transistors, when said damageable MOS transistors are in said ON STATE current flow between said drains and said sources of said damageable MOS transistors is permitted, when said damageable MOS transistors are in said OFF STATE current flow between said drains and said sources of said damageable MOS transistors is substantively not permitted;
a programming circuit that has a first group of MOS transistors and a second group of MOS transistors, said first group of MOS transistors and said second group of MOS transistors being comprised of subsets of said plurality of damageable MOS type transistors, said first group of MOS transistors comprising at least one damageable MOS transistor, said gates of said first group of MOS transistors being connected to said first electrical node SN of said SRAM cell, said drains and said sources of said first group of MOS transistors being connected in series between a programming Power Line PL and a third electrical node C, said second group of MOS transistors comprising at least one damageable MOS type transistor, said gates of said second group of MOS transistors being connected to said second electrical node SNB of said SRAM cell, said drains and said sources of said second group of MOS transistors being connected in series between said programming Power Line PL and said third electrical node C;
an OTP cell circuit that is a combination of said SRAM cell circuit and said programming circuit; and, a programming system for said OTP cell circuit that:
  powers said OTP cell circuit such that said SRAM cell circuit is operational and said programming Power Line PL and said third electrical node C are at a normal operation equivalent voltage level;
  stores a desired data value in said SRAM cell circuit such that said electrical node SN is at said desired data value and said electrical node SNB is at said complementary data value of said desired data value;
  programs said programming circuit to a programmed state by connecting said third electrical Node C to said Vdd voltage and by applying a programming voltage to said programming Power Line PL, said programming voltage being a voltage that causes said voltage differential between said programming Power Line PL and said third electrical node C to substantively be said burn-in voltage, thereby causing whichever of said first group of MOS transistors and said second group of MOS transistors is in said ON STATE to break down and short out, which of said first group of MOS transistors and said second group of MOS transistors is in said ON STATE being determined by said SN data value connected to said gates of said first group of MOS transistors and said SNB data value that is said complementary data value of said SN data value connected to said gates of said second group of MOS transistors of said SRAM cell circuit; and,
  sets said programming Power Line PL and said third electrical node C to said normal operation equivalent voltage level applied prior to said programming such that whichever of said first group of MOS transistors connected to electrical node SN of said SRAM cell circuit and said second group of MOS transistors connected to said electrical node SNB of said SRAM cell circuit was broken down and shorted out during programming to electrically connect said respective electrical node SN or said electrical node SNB of said SRAM cell circuit to said normal operation equivalent voltage level of said electrical node C and said programming Power Line PL, thereby forcing said respective electrical node SN or electrical node SNB to correspond to said HIGH or LOW data value corresponding to said normal operation equivalent voltage level of said electrical node C and said programming Power Line PL regardless of attempts to write a different data value to said SRAM cell circuit.

11. The one-time-programmable (OTP) memory device of claim 10 further comprising:
  a plurality of said OTP cell circuits that create an OTP memory array such that said OTP memory array provides a desired amount of OTP memory storage, each programming circuit of said OTP memory array connected to a common programming Power Line PL and a common third electrical node C such that said plurality of said OTP cell circuits are programmed concurrently by said programming voltage applied to said programming Power Line PL.

12. The one-time-programmable (OTP) memory device of claim 11 further comprising:
  a plurality of said OTP memory arrays, each OTP memory array of said plurality of memory arrays having a separate common programming Power Line PL such that each OTP memory array of said plurality of memory arrays may be programmed independently of other memory arrays in said plurality of memory arrays;
  a first subset group of OTP memory arrays of said plurality of OTP memory arrays programmed to permanently store a desired data set; and,
  a second subset group of OTP memory arrays of said plurality of memory arrays that operate as standard SRAM volatile memory.

13. The one-time-programmable (OTP) memory device of claim 10 wherein said programming system further comprises:
  cycling voltage applied to said programming Power Line PL between said programming voltage and a secondary non-stressing voltage for a predetermined number of cycles at a predetermined length for each cycle, said predetermined number of cycles and said predetermined length for each cycle determined according to said damageable MOS technology characteristics.

14. The one-time-programmable (OTP) memory device of claim 13:
  wherein said secondary non-stressing voltage is one of the group comprising: said Vdd voltage, said Vss voltage, electrical ground, and zero volts; and,
  wherein said normal operation equivalent voltage is one of the group comprising: said Vdd voltage, said Vss voltage, and electrical ground.

15. The one-time-programmable (OTP) memory device of claim 13 wherein said burn-in voltage that approaches said trigger voltage $V_{TR}$ of said damageable MOS transistors is substantively within one volt of reaching said trigger voltage $V_{TR}$.

16. The one-time-programmable (OTP) memory device of claim 10:
  wherein said damageable MOS transistors used in said programming circuit are folded-gate devices;
  wherein said SRAM cell circuit is placed on a separate piece of diffusion from said programming circuit; and,
  wherein channel types of said damageable MOS transistors used in said programming circuit are one of the group comprising: p-channel (PMOS) and n-channel (NMOS).

17. The one-time-programmable (OTP) memory device of claim 10 further comprising a cell power supply that powers up said SRAM cell circuit by ramping up at a controlled slower rate than that for said programming circuit such that said SRAM cell circuit is powered up after said programming circuit and said SRAM cell circuit is returned to said programmed state on OTP cell circuit start-up.

18. The one-time-programmable (OTP) memory device of claim 10 wherein said SRAM cell circuit is a volatile memory cell circuit based on a non-SRAM circuit structure that has electrical nodes that substantively correspond to said electrical node SN at said SN data value and said electrical node SNB at said complementary data value of said SN data value and are connected to said programming circuit as are said electrical node SN and said electrical node SNB.

* * * * *